(12) United States Patent
Bell et al.

(10) Patent No.: US 6,989,332 B1
(45) Date of Patent: *Jan. 24, 2006

(54) ION IMPLANTATION TO MODULATE AMORPHOUS CARBON STRESS

(75) Inventors: Scott A. Bell, San Jose, CA (US); Srikanteswara Dakshina-Murthy, Austin, TX (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 342 days.

This patent is subject to a terminal disclaimer.

(21) Appl. No.: 10/217,730

(22) Filed: Aug. 13, 2002

(51) Int. Cl.
*H01L 21/302* (2006.01)

(52) U.S. Cl. ..................... 438/719; 438/766

(58) Field of Classification Search ............... 438/706, 438/714, 719, 723, 724, 766, 778
See application file for complete search history.

(56) References Cited

U.S. PATENT DOCUMENTS

| | | | |
|---|---|---|---|
| 4,382,100 A | 5/1983 | Holland | |
| 5,185,293 A | 2/1993 | Franke et al. | |
| 5,385,762 A | 1/1995 | Prins | |
| 5,559,367 A * | 9/1996 | Cohen et al. | ............... 257/77 |
| 5,656,128 A | 8/1997 | Hashimoto et al. | |
| 5,679,608 A | 10/1997 | Cheung et al. | |
| 5,721,090 A | 2/1998 | Okamoto et al. | |
| 5,759,746 A | 6/1998 | Azuma et al. | |
| 5,776,602 A | 7/1998 | Ueda et al. | |
| 5,837,357 A | 11/1998 | Matsuo et al. | |
| 5,891,575 A | 4/1999 | Marchywka et al. | |
| 5,981,398 A | 11/1999 | Tsai et al. | |
| 6,030,541 A | 2/2000 | Adkisson et al. | |
| 6,087,274 A * | 7/2000 | Tonucci et al. | ............. 438/758 |
| 6,121,158 A | 9/2000 | Benchikha et al. | |
| 6,140,200 A | 10/2000 | Eldridge | |
| 6,171,343 B1 | 1/2001 | Dearnaley et al. | |
| 6,350,390 B1 | 2/2002 | Liu et al. | |
| 6,365,320 B1 | 4/2002 | Foote et al. | |
| 6,368,924 B1 | 4/2002 | Mancini et al. | |
| 6,388,924 B1 | 5/2002 | Nasu | |
| 6,413,852 B1 | 7/2002 | Grill et al. | |
| 6,428,894 B1 | 8/2002 | Babich et al. | |
| 6,573,030 B1 | 6/2003 | Fairbairn et al. | |
| 6,596,553 B1 | 7/2003 | Lin et al. | |
| 6,673,684 B1 * | 1/2004 | Huang et al. | ............... 438/299 |
| 6,750,127 B1 * | 6/2004 | Chang et al. | ............... 438/585 |

OTHER PUBLICATIONS

U.S. Appl. No. 10/215,173, entitled "Use of Amorphous Carbon Hard Mask for Gate Patterning to Eliminate Requirement of Poly Re-Oxidation", as filed on Aug. 8, 2002, including claims, drawings, and abstract (29 pages).
U.S. Appl. No. 10/277,760, entitled "Sacrificial Air Gap Layer for Insulation of Metals", as filed on Aug. 8, 2002, including claims, drawings, and abstract (17 pages).

(Continued)

*Primary Examiner*—Kin-Chan Chen
(74) *Attorney, Agent, or Firm*—Foley & Lardner LLP

(57) ABSTRACT

A method of manufacturing an integrated circuit includes providing a layer of polysilicon material above a semiconductor substrate. A layer of amorphous carbon is provided above the layer of polysilicon material and inert ions are implanted into the amorphous carbon layer. The layer of amorphous carbon is patterned to form an amorphous carbon mask, and a feature is formed in the layer of polysilicon according to the amorphous carbon mask.

20 Claims, 6 Drawing Sheets

OTHER PUBLICATIONS

U.S. Appl. No. 10/244,650, entitled "Use of Multilayer Amorphous Carbon Arc Stack to Eliminate Line Warpage Phenomenon", as filed on Sep. 16, 2002, including claims, drawings, and abstract (30 pages).

U.S. Appl. No. 10/424,420, entitled "Use of Amorphous Carbon for Gate Patterning", as filed on Apr. 28, 2003, by including claims, drawings, and abstract (30 pages).

U.S. Appl. No. 10/230,794, entitled "Formation of Amorphous Carbon Arc Stack Having Graded Transition Between Amorphous Carbon and Arc Material", as filed on Aug. 29, 2002, including claims, drawings, and abstract (29 pages).

U.S. Appl. No. 10/230,775, entitled "Use of Buffer Dielectric Layer with Amorphous Carbon Mask to Reduce Line Warpage", as filed on Aug. 29, 2002, including claims, drawings, and abstract (28 pages).

U.S. Appl. No. 10/335,726, entitled "Use of Diamond as a Hard Mask Material", as filed on Jan. 2, 2003, including claims, drawings, and abstract (26 pages).

U.S. Appl. No. 10/424,675, entitled "Selective Stress-Inducing Implant and Resulting Pattern Distortion in Amorphous Carbon Patterning", as filed on Apr. 28, 2003, including claims, drawings, and abstract (28 pages).

U.S. Appl. No. 10/445,129, entitled "Modified Film Stack and Patterning Strategy for Stress Compensation and Prevention of Pattern Distortion in Amorphous Carbon Gate Patterning", as filed on May 20, 2003, including claims, drawings, and abstract (29 pages).

Yamaguchi, A. et al., "Ar Ion implantation into Resist For Etching Resistance Improvement", Proceedings of SPIE vol. 4345 (2001), pp. 655-664.

Borzenko, V. et al., "The Effect of Ion Implantation On Polymer Mask Resistance To Ion Beam Etching", Vacuum, 38, 1007 (1988), pp. 1007-1009.

R. Gago, et al., "Bonding and hardness in nonhydrogenated carbon films with moderate $sp^3$ content", Journal of Applied Physics, vol. 87, No. 11, Jun. 1, 2000, 7 pgs.

Wolf, S., Tauber, R. N., "Silicon Processing For the VLSI Era", Lattice Press, Sunset Beach, CA; 1986; pp. 322, 384-385, 556-557.

* cited by examiner

ION IMPLANTATION TO MODULATE AMORPHOUS CARBON STRESS

CROSS-REFERENCE TO RELATED PATENT APPLICATIONS

This application is related to U.S. patent application Ser. No. 10/215,173 filed Aug. 8, 2002 and entitled "Use of Amorphous Carbon Hard Mask for Gate Patterning to Eliminate Requirement of Poly Re-Oxidation," U.S. patent application Ser. No. 10/277,760 filed Oct. 22, 2002 and entitled "Sacrificial Air Gap Layer for Insulation of Metals," U.S. patent application Ser. No. 10/244,650 filed Sep. 16, 2002 and entitled "Use of Multilayer Amorphous Carbon Hard Mask to Eliminate Line Warpage Phenomenon," U.S. patent application Ser. No. 10/424,420 filed Apr. 28, 2003 and entitled "Use of Amorphous Carbon for Gate Patterning," U.S. patent application Ser. No. 10/230,794 filed Aug. 29, 2002 and entitled "Formation of Amorphous Carbon ARC Stack Having Graded Transition Between Amorphous Carbon and ARC Material," U.S. patent application Ser. No. 10/335,726 filed Jan. 2, 2003 and entitled "Use of Diamond as a Hard Mask Material," U.S. patent application Ser. No. 10/424,675 filed Apr. 28, 2003 and entitled "Selective Stress-Inducing Implant and Resulting Pattern Distortion in Amorphous Carbon Patterning," U.S. patent application Ser. No. 10/230,775 filed Aug. 29, 2002 entitled "Use of Buffer Dielectric Layer with Amorphous Carbon Mask to Reduce Line Warpage," and U.S. patent application Ser. No. 10/445,129 filed May 20, 2003 and entitled "Modified Film Stack and Patterning Strategy for Stress Compensation and Prevention of Pattern Distortion in Amorphous Carbon Gate Patterning," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOS-FETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive or tensile stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use amorphous carbon as a mask in the formation of integrated circuit structures.

SUMMARY OF THE INVENTION

An exemplary embodiment relates to a method of manufacturing an integrated circuit. The method includes providing a layer of polysilicon material above a semiconductor substrate and providing a layer of amorphous carbon above the layer of polysilicon material. the method also includes implanting the layer of amorphous carbon with inert ions, patterning the layer of amorphous carbon to form an amorphous carbon mask, and forming a feature in the layer of polysilicon material according to the amorphous carbon mask.

Another exemplary embodiment relates to a method of forming features in an integrated circuit using an amorphous carbon hard mask. The method includes depositing a layer including amorphous carbon above a layer of conductive material and a semiconductor substrate and introducing inert ions into the layer including amorphous carbon. The method also includes removing at least a portion of the layer including amorphous carbon to form a hard mask and forming a feature in the layer of conductive material by etching the layer of conductive material in accordance with the hard mask. The method further includes removing the hard mask.

A further exemplary embodiment relates to an integrated circuit having a plurality of conductive lines with improved shape integrity. The integrated circuit is produced by a method that includes providing a carbon layer above a layer of polysilicon, where the carbon layer is doped with an inert ion species. The method also includes etching the carbon layer to form an carbon hard mask and etching the polysilicon layer according to the carbon hard mask to form a conductive line. The method further includes removing the carbon hard mask.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
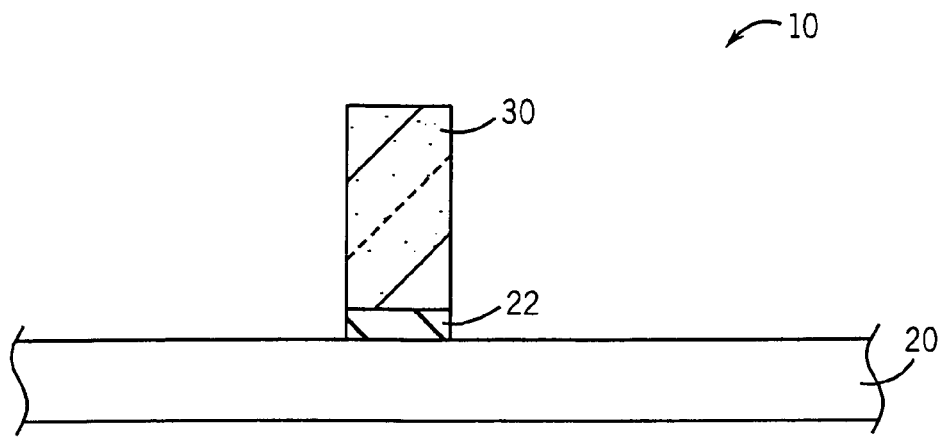
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 50 and 150 nanometers and a width of between approximately 10 and 80 nanometers.

Figure 2A:
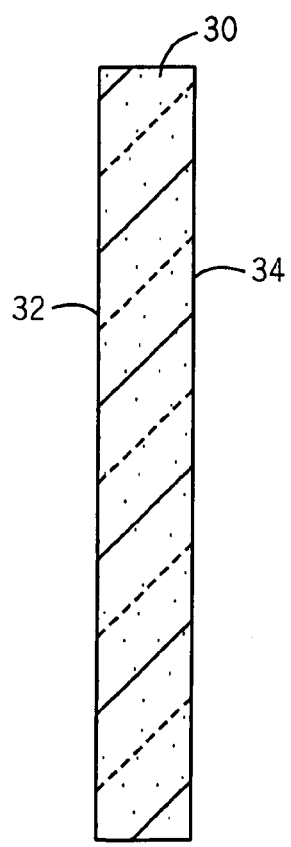
FIG. 2A is a top elevation view of the integrated circuit portion shown in FIG. 1 showing a feature formed without warpage.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

Figure 2B:
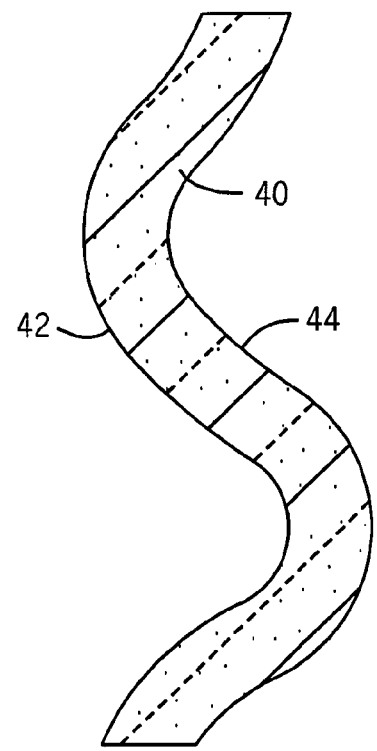
FIG. 2B is a top elevation view of a feature similar to that shown in FIG. 2A showing a warpage phenomenon.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others.

One material that may be used as a hard mask in the formation of integrated circuit structures having reduced critical dimensions (e.g., approximately 30–50 nanometers or less) is amorphous carbon. It has been discovered that when a layer of amorphous carbon material is patterned to provide a hard mask for features having reduced critical dimensions, shape integrity may be impaired due to the internal properties of the amorphous carbon material. One theory currently being investigated is that internal stresses (e.g., compressive or tensile stresses) in the amorphous carbon material cause the mask to deform. For example, where a layer of amorphous carbon is patterned to form a mask for a conductive line to be formed in a material underlying the mask, a cap layer or anti-reflective coating (ARC) layer may be provided above the amorphous carbon pattern. When this cap or ARC layer is removed, stresses in the amorphous carbon material may cause the mask to buckle or deform to produce a wavy or serpentine pattern. This pattern is then transferred to the conductive line material in a subsequent etching step.

A method for producing portion 10 that reduces or eliminates warpage in the formation of conductive line 30 will now be described with reference to FIGS. 3 to 9. FIG. 10 is a flow diagram that outlines the process 200 used in the formation of portion 10.

Figure 3:
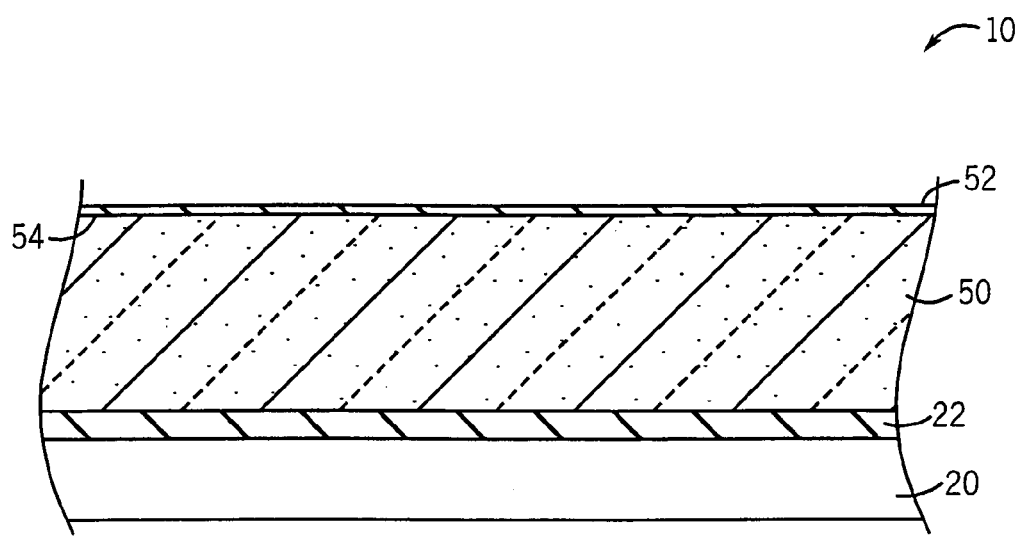
FIG. 3 is a schematic cross-sectional view of the portion shown in FIG. 1 illustrating a polysilicon deposition step.

In a step 210 illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, etc.), including high dielectric constant materials such as $HfO_2$, $HfSi_xO_y$, $Hf_xAl_ySi_zO_a$, and the like. In an exemplary embodiment, layer 50 is polysilicon and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,500 and 2,000 angstroms and layer 22 has a thickness of between approximately 10 and 20 angstroms. In an alternative embodiment, layer 50 has a thickness of between approximately 1,000 and 2,500 angstroms and layer 22 has a thickness of approximately 15 angstroms. Alternatively, layer 22 can be other types of materials used in the formation of narrow lines or structures.

When layer 50 is formed, a thin layer 52 of oxide forms on the top or upper surface 54 of polysilicon layer 50. Oxide layer 52 may be referred to as a "native" oxide layer. The thickness of oxide layer 52 may vary depending on various processing conditions. In an exemplary embodiment, the thickness of oxide layer 52 is between approximately 5 and 20 angstroms.

Figure 4:
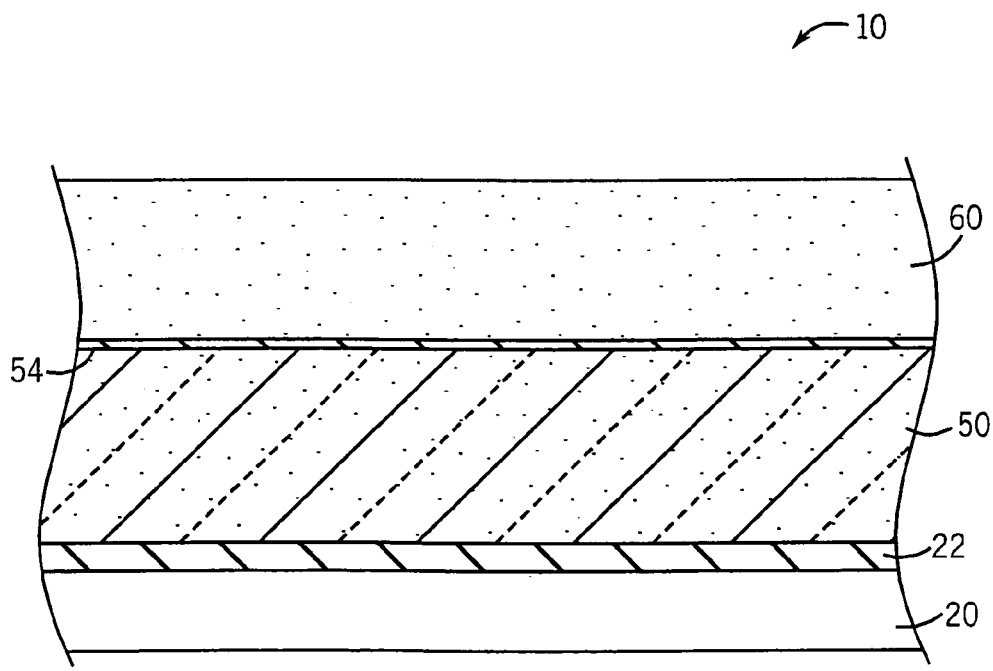
FIG. 4 is a schematic cross-sectional view of the portion shown in FIG. 1 illustrating an amorphous carbon layer deposition step.

In a step 220 shown in FIG. 4, a layer or film 60 of amorphous carbon material is deposited above or over polysilicon layer 50. Layer 60 is deposited in a plasma-enhanced chemical vapor deposition (PECVD) process using an atmosphere of hydrocarbon precursor, such as ethylene, propylene, methane, and the like. The PECVD process is performed at a temperature of between approximately 400° and 550° C. and a pressure of between approximately 5 and 10 torr with a plasma power of between approximately 800 and 1,500 watts.

In a preferred embodiment, amorphous carbon layer 60 has a thickness of between approximately 500 and 700 angstroms. In alternative embodiments, the thickness of amorphous carbon layer 60 may vary depending on various design considerations. For example, the amorphous carbon layer may have a thickness of less than 500 angstroms (e.g., between 300 and 500 angstroms or less). In another alternative embodiment, the amorphous carbon layer may have a thickness of greater than 700 angstroms (e.g., between 700 and 900 angstroms or greater).

One advantageous feature of providing an amorphous carbon layer that may be produced with various thicknesses is that the amorphous carbon layer may be produced in a thickness suitable for patterning polysilicon layer 50. For example, where a particular thickness of polysilicon is provided, the thickness of the amorphous carbon layer may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above polysilicon layer 50 in a pure or undoped form. In an alternative embodiment, the amorphous carbon layer may be deposited with nitrogen incorporated therein. For example, the amorphous carbon layer as deposited may include between approximately 0 and 10 atomic percent nitrogen. To deposit a nitrogen-containing amorphous carbon layer, a PECVD process using an atmosphere of hydrocarbon precursor and nitrogen is used. To achieve a doping concentration of approximately 6 atomic percent nitrogen, for example, a flow ratio approximately 1:10 is used for the hydrocarbon to nitrogen gas flow rate (e.g., 300 cubic centimeters of hydrocarbon per minute to 3 liters of nitrogen per minute). In alternative embodiments, various other nitrogen concentrations may be achieved by varying the various processing conditions (e.g., increasing or decreasing the gas flow ratio of hydrocarbon to nitrogen, etc.).

In another alternative embodiment, only a portion of the amorphous carbon layer is doped with nitrogen. For example, a top portion of the amorphous carbon layer may be doped with nitrogen, while a bottom portion of the amorphous carbon layer may comprise pure or undoped amorphous carbon. In another example, the amorphous carbon layer may include alternating layers of nitrogen-doped and undoped amorphous carbon material.

Figure 5:
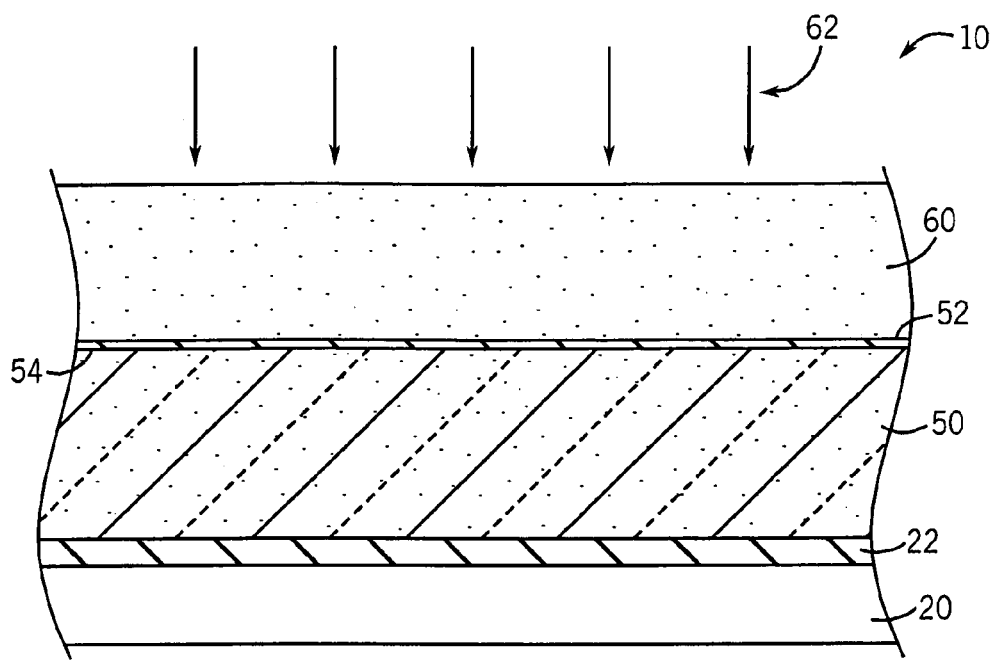
FIG. 5 is a schematic cross-sectional view of the portion shown in FIG. 1 illustrating an ion implantation step.

In a step 230 shown in FIG. 5, an inert ion species 62 is implanted or introduced into amorphous carbon layer 60. The implantation of ions into the amorphous carbon layer may be performed in both nitrogen-doped and undoped amorphous carbon layers. Any of a variety of inert ions may be introduced or implanted into amorphous carbon layer 60, including helium (He), argon (Ar), neon (Ne), krypton (Kr), xenon (Xe), and radon (Rn). Additionally, more than one inert ion species may be introduced into amorphous carbon layer 60. For example, both helium and xenon ions may be implanted into amorphous carbon layer 60. Other combinations are also possible in various alternative embodiments.

The implantation or doping of amorphous carbon layer 60 with inert ions may relieve or reduce the internal stress of amorphous carbon layer 60. For example, where the internal stress of the amorphous carbon layer is generally compressive, the introduction of inert ions into the amorphous carbon layer may reduce the compressive stress or change the internal stress to tensile stress. One advantageous feature of altering the stress profile of amorphous carbon layer 60 is that better shape integrity of patterns formed in amorphous carbon layer 60 may be obtained. For example, where amorphous carbon layer 60 is patterned to form a mask for creating a conductive line in an underlying material layer, reduced or altered internal stresses in the amorphous carbon mask may allow the mask to better retain its shape during processing, thus allowing the formation of conductive lines that do not exhibit warpage or wiggle characteristics.

Inert ion species 62 may be implanted at an energy of between approximately 30 keV and 150 keV. In a preferred embodiment, amorphous carbon layer 60 comprises between approximately $1\times10^{14}$ to $1\times10^{16}$ ions/cm$^2$ deposited at an energy of between approximately 50 keV and 80 keV using any of a variety of commercial implanting machines (e.g., an AMAT 9500, etc.). In an alternative embodiment, the amorphous carbon layer inert ion concentration may be between approximately $1\times10^{16}$ to $1\times10^{17}$ ions/cm$^2$. In another alternative embodiment where multiple types of inert ion species are introduced into an amorphous carbon layer, the atomic percentages of the various species may be identical or may differ. For example, an amorphous carbon layer may be implanted with approximately 10 atomic percent argon and approximately 10 atomic percent xenon.

While FIG. 5 illustrates a situation in which inert ions are implanted into an amorphous carbon layer that has been entirely deposited, the manner in which inert ions are introduced into the amorphous carbon layer may vary in alternative embodiments. For example, a first portion of an amorphous carbon layer may be deposited, after which an inert ion species may be implanted into the first portion. A second portion of the amorphous carbon layer may then be deposited over the first portion. In this manner, a portion of an amorphous carbon layer having implanted inert ions may be overlaid with pure amorphous carbon. In other alternative embodiments, various methods of amorphous carbon layer deposition and implantation may be used to form amorphous carbon layers having any of a variety of compositions. For example, an amorphous carbon layer may include a first portion of pure amorphous carbon, a second portion of amorphous carbon doped with inert ions, and a third portion deposited with nitrogen ions incorporated therein. These various portions may be deposited in any order. Further, a different number of portions may be provided in an amorphous carbon layer. It will be recognized by those of skill in the art that the various compositions of the amorphous carbon layer including an implanted inert ion species may be altered in a number of ways without departing from the spirit and scope of the invention described herein.

To facilitate the description below, amorphous carbon layer 60 will be described with reference to the preferred embodiment described above, in which a layer of amorphous carbon is deposited in pure form (i.e., without nitrogen ions being incorporated therein) and then implanted with an inert ion species. It should be understood to one of skill in the art that the amorphous carbon layer may be formed in any of a variety of ways depending on the desired amorphous carbon layer properties, as described above with regard to the various alternative embodiments.

Figure 6:
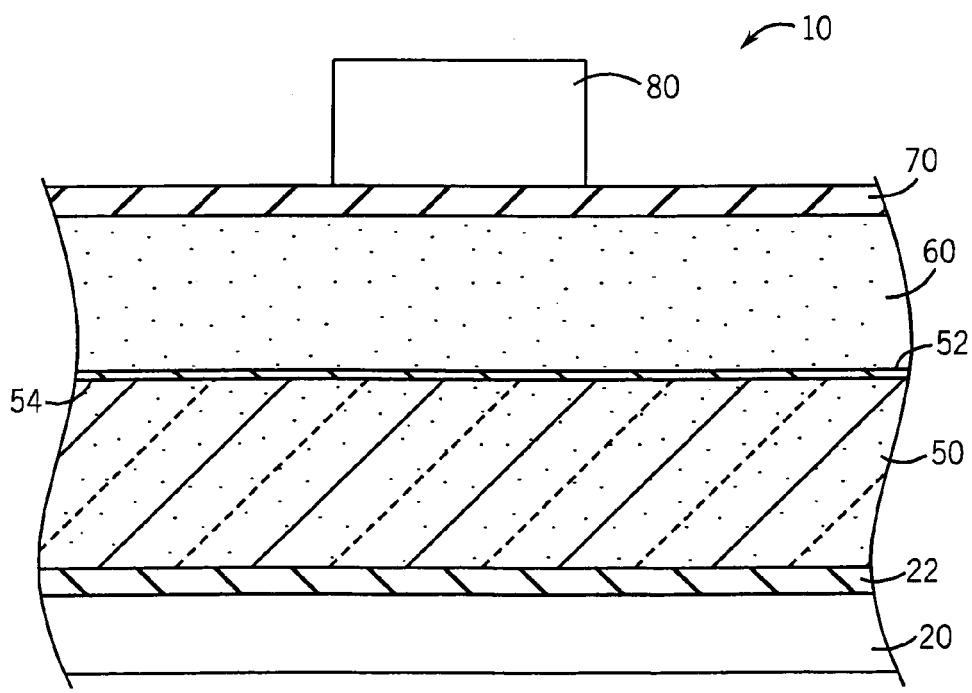
FIG. 6 is a schematic cross-sectional view of the portion shown in FIG. 1 illustrating an anti-reflective coating (ARC) layer deposition and mask formation step.

In a step 240 shown in FIG. 6, a cap layer 70 is deposited above or over amorphous carbon layer 60. Cap layer 70 may be formed of an anti-reflective material to form an anti-reflective coating (ARC) layer. Cap layer 70 may be include silicon nitride (SiN), silicon oxynitride (SiON), silicon-rich oxide (e.g., non-stoichiometric oxide-containing silicon material), silicon-rich nitride, and the like. In an exemplary embodiment, Cap layer 70 has a thickness of between approximately 200 and 250 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be reduced.

In a step 250, a layer of photoresist material is deposited above or over cap layer 70 (e.g., by spin-coating) and exposed to form a photoresist feature 80. The layer of photoresist is deposited by spin coating at a thickness of between approximately 50 and 400 nanometers and is patterned to have a width of between approximately 80 and 180 nanometers. Any of a variety of photoresist materials may be used, including photoresist materials that may be etched using UV rays having wavelengths of 193 or 248 nanometers.

Figure 7:
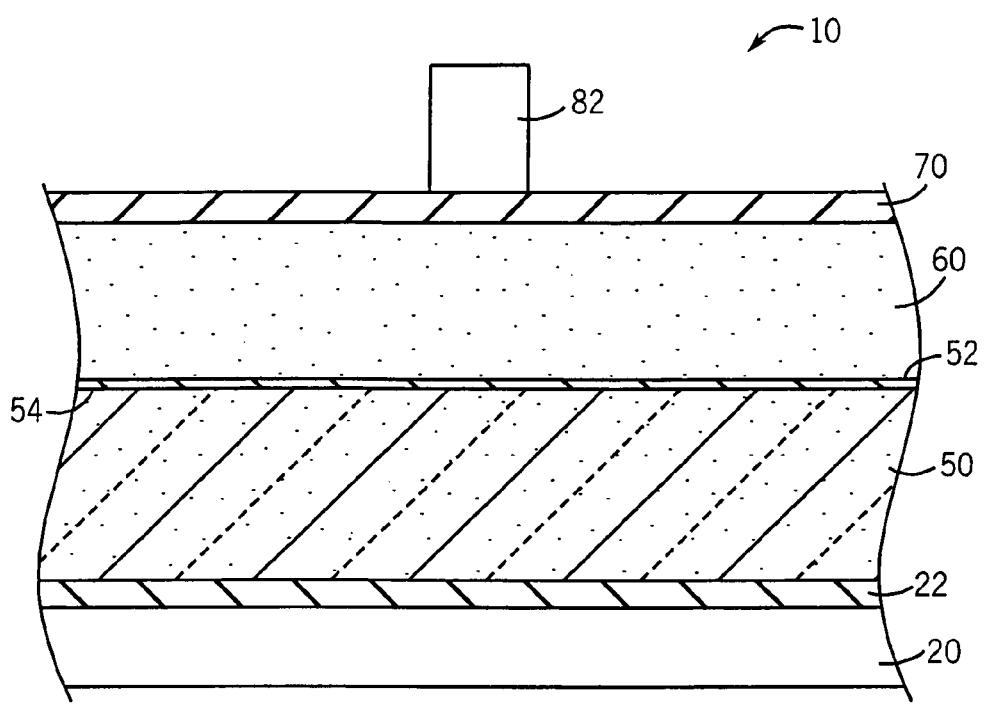
FIG. 7 is a schematic cross-sectional view of the portion shown in FIG. 1 illustrating a mask trimming step.

In a step 260 shown in FIG. 7, photoresist feature 80 is trimmed to form a photoresist mask 82 having reduced dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques.

In an exemplary embodiment, photoresist mask 82 has a thickness of between approximately 10 and 300 nanometers and a width of between approximately 10 and 60 nanometers after trim etching. In alternative embodiments, photoresist mask may have a thickness of between approximately 50 and 100 angstroms and a width of approximately 5 and 30 nanometers.

Figure 8:
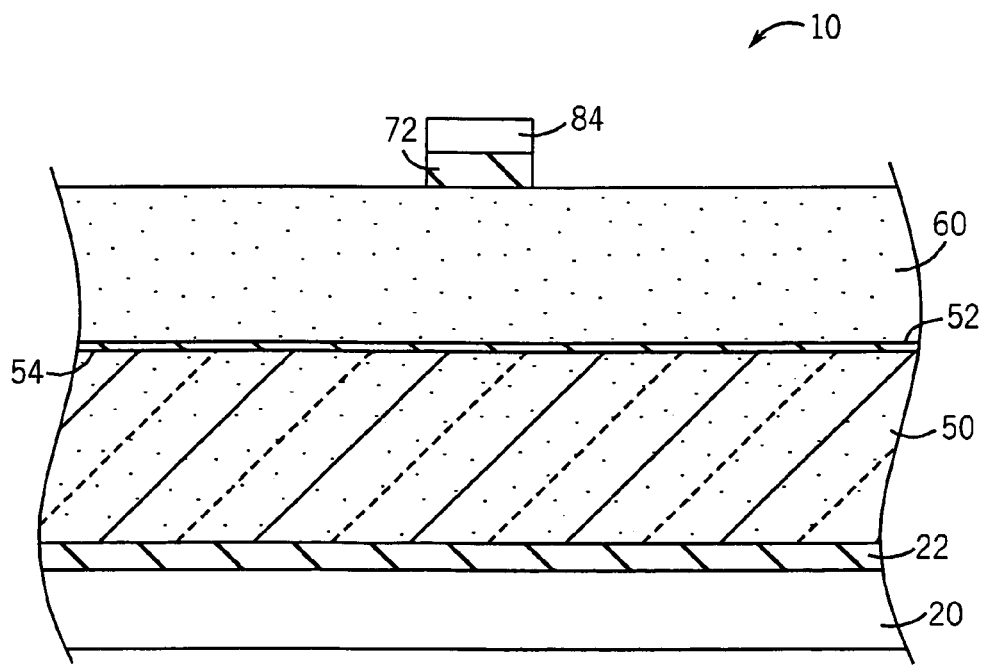
FIG. 8 is a schematic cross-sectional view of the portion shown in FIG. 1 illustrating the formation of a mask for patterning an amorphous carbon layer.

In a step 270 shown in FIG. 8, photoresist mask 82 is used as a mask to pattern cap layer 70 to form a cap feature 72. A small amount of photoresist material 84 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or a mixture of $CF_4$ and argon atmosphere at a temperature of approximately 50° C. and a pressure of approximately 4 millitorr.

Figure 9:
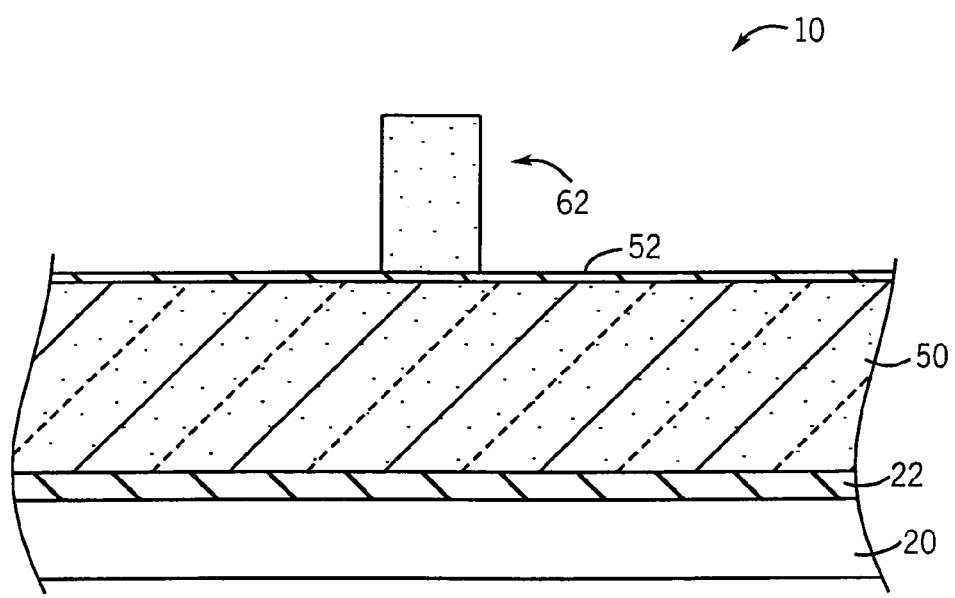
FIG. 9 is a schematic cross-sectional view of the portion shown in FIG. 1 illustrating the formation of an amorphous carbon mask feature.
Figure 10:
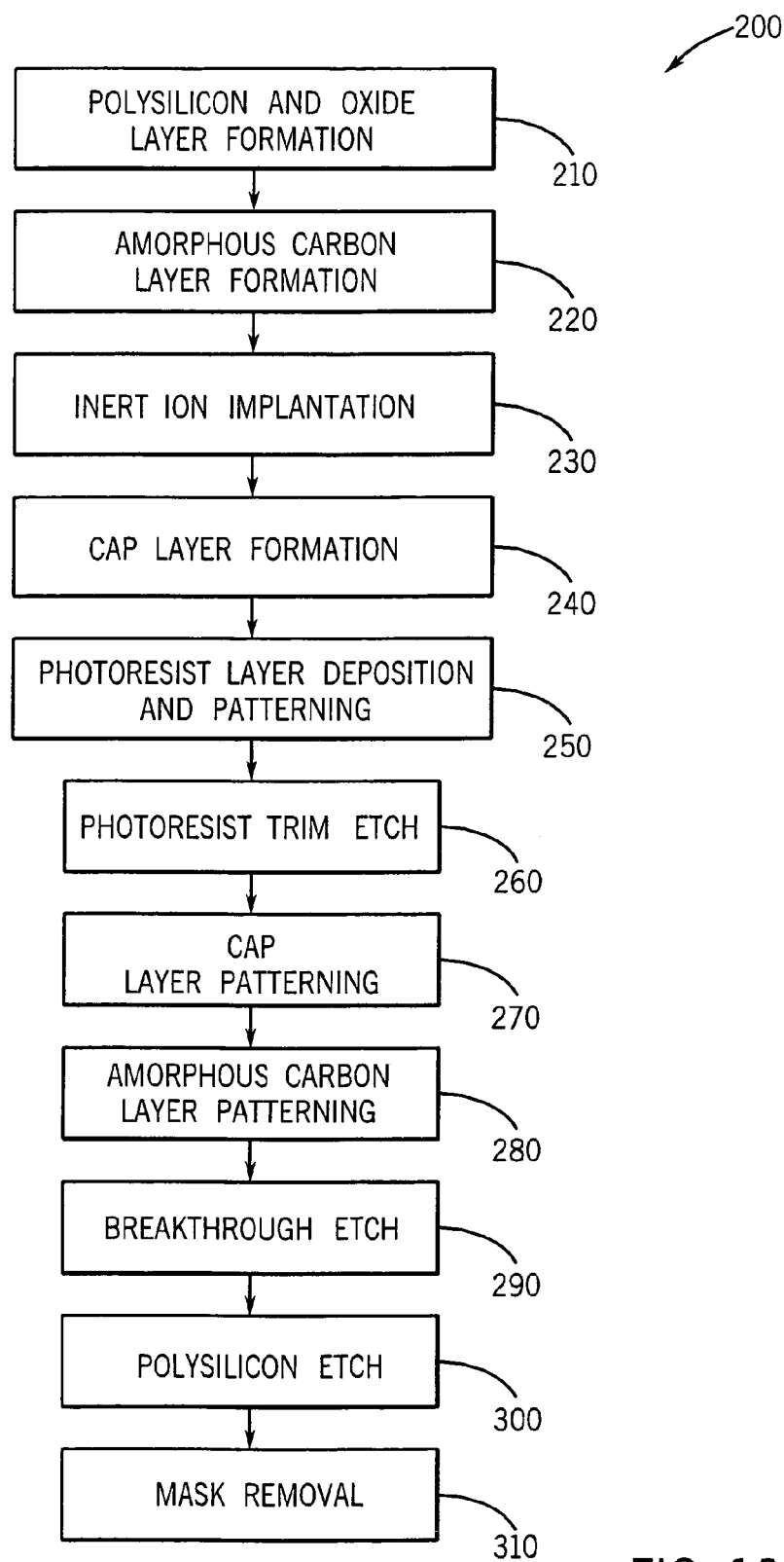
FIG. 10 is a flow diagram illustrating the process of forming structures in an integrated circuit.

In a step 280 shown in FIG. 9, cap feature 72 is used as a mask to pattern amorphous carbon layer 60 to form amorphous carbon mask 62. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts. The etch can be performed in either a reactive ion etch or high density plasma etch tool. During etching of amorphous carbon layer 60, any remaining photoresist (e.g., 94 shown in FIG. 8) is removed.

In an exemplary embodiment, amorphous carbon mask 62 has a width of between approximately 10 and 60 nanometers. The use of an amorphous carbon hard mask eliminates the need for wet removal of ARC material. For example, the use of phosphoric acid as an etchant is eliminated by using a mask layer of amorphous carbon, since portions of the amorphous carbon layer may be removed using a plasma etch.

In a step 290, a breakthrough or native oxide removal etch is performed to remove oxide layer 52 from the surface of polysilicon layer 50 prior to patterning polysilicon layer 50. The breakthrough etch also removes any remaining cap material (e.g., SiON, SiRN, etc.) located on top of amorphous carbon mask 62. The breakthrough etch step is performed using the same conditions as described above with respect to the cap etch (e.g., using a fluorine-based plasma).

In a step 300, amorphous carbon mask 62 is used to pattern or form features in polysilicon layer 50. For example, polysilicon layer 50 may be etched to form conductive line 30 (shown in FIG. 1). The polysilicon etch is performed using an $HBr/Cl_2/HeO_2/CF_4$ mixture at a temperature of between approximately 40 and 70° C. and a pressure of between approximately 3 and 10 millitorr. In subsequent steps (not shown), additional material layers and features may be formed on or in portion 10.

In a step 310, amorphous carbon mask 62 is removed after polysilicon layer 50 is patterned (e.g., to form conductive line 30 shown in FIG. 1). The amorphous carbon mask may be removed using a method similar to that described above, in which an oxygen-containing plasma may be used to remove or "ash" away the amorphous carbon mask to expose the top surface of conductive line 30. In subsequent processing steps, other material layers and devices may be added to portion 10 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method of manufacturing an integrated circuit comprising:
    providing a layer of polysilicon material above a semiconductor substrate;
    providing a layer of amorphous carbon above the layer of polysilicon material;
    implanting the layer of amorphous carbon with inert ions;
    patterning the layer of amorphous carbon to form an amorphous carbon mask; and
    forming a feature in the layer of polysilicon material according to the amorphous carbon mask.

2. The method of claim 1, wherein the inert ions are selected from at least one of helium, neon, argon, krypton, xenon, and radon ions.

3. The method of claim 1, wherein after the step of implanting the layer of amorphous carbon with inert ions the layer of amorphous carbon comprises between approximately $1 \times 10^{14}$ and $1 \times 10^{16}$ ions/cm$^2$.

4. The method of claim 1, wherein the step of implanting the layer of amorphous carbon with inert ions comprises implanting the inert ions with an implant energy of between approximately 30 keV and 150 keV.

5. The method of claim 1, wherein the layer of amorphous carbon has a thickness between approximately 500 and 700 angstroms.

6. The method of claim 1, wherein the feature formed in the layer of polysilicon material is a gate conductor having a critical dimension of between approximately 30 and 50 nanometers.

7. The method of claim 1, wherein the step of patterning the layer of amorphous carbon comprises providing an anti-reflective coating (ARC) layer above the layer of amorphous carbon and patterning the ARC layer.

8. The method of claim 7, wherein the ARC layer comprises at least one of silicon oxynitride, silicon nitride, silicon-rich oxide, and silicon-rich nitride.

9. A method of forming features in an integrated circuit using an amorphous carbon hard mask, the method comprising:
    depositing a layer including amorphous carbon above a layer of conductive material and a semiconductor substrate;
    introducing inert ions into the layer including amorphous carbon;
    removing at least a portion of the layer including amorphous carbon to form a hard mask;
    forming a feature in the layer of conductive material by etching the layer of conductive material in accordance with the hard mask; and
    removing the hard mask.

10. The method of claim 9, wherein the inert ions include at least one of helium, neon, argon, krypton, xenon, and radon ions.

11. The method of claim 9, wherein the step of introducing inert ions into the layer of amorphous carbon comprises implanting the inert ions at an energy of between approximately 30 keV and 150 keV.

12. The method of claim 9, wherein the step of introducing inert ions into the layer including amorphous carbon produces a layer including amorphous carbon and having an inert ion concentration of between approximately $1 \times 10^{14}$ and $1 \times 10^{16}$ ions/cm$^2$.

13. The method of claim 9, wherein the step of removing at least a portion of the layer including amorphous carbon comprises using an oxygen-based plasma etch.

14. The method of claim 9, wherein the step of removing at least a portion of the layer including amorphous carbon comprises depositing an anti-reflective coating (ARC) layer above the layer including amorphous carbon and removing at least a portion of the ARC layer.

15. The method of claim 14, wherein the step of removing at least a portion of the ARC layer comprises providing a layer of photoresist material above the ARC layer and exposing the layer of photoresist material to form a photoresist mask.

16. The method of claim 9, wherein the conductive material layer is polysilicon and the feature is a conductive line having a width of between approximately 30 and 50 nanometers.

17. A method of producing an integrated circuit having a plurality of conductive lines with improved shape integrity, the method comprising:
    providing a carbon layer above a layer of polysilicon, the carbon layer being doped with an inert ion species;
    etching the carbon layer to form a carbon hard mask;
    etching the layer of polysilicon according to the carbon hard mask to form a conductive line; and
    removing the carbon hard mask;
    whereby doping the carbon layer with an inert ion species relieves at least a portion of the internal stress of the carbon layer.

18. The method of claim 17, wherein the method further comprises providing a cap layer over the carbon layer and forming a pattern in the cap layer, wherein the cap layer comprises an anti-reflective coating (ARC) material.

19. The method of claim 17, wherein the steps of etching the carbon layer and removing the carbon hard mask comprise exposing the carbon layer and carbon hard mask to an oxygen-based plasma.

20. The method of claim 17, wherein the conductive line has a width of between approximately 30 and 50 nanometers.

* * * * *